United States Patent [19]

Sekine et al.

[11] 4,255,730
[45] Mar. 10, 1981

[54] MICROWAVE INTEGRATED CIRCUIT DEVICE

[75] Inventors: Kenji Sekine, Hinodemachi; Yoichi Kaneko, Tokorozawa, both of Japan

[73] Assignee: Hitachi, Ltd., Japan

[21] Appl. No.: 954,118

[22] Filed: Oct. 24, 1978

[51] Int. Cl.³ .................. H01P 5/00; G01S 13/00; H04B 1/40; H03D 9/02
[52] U.S. Cl. .................. 333/247; 329/161; 333/250; 343/5 DD; 343/700 MS; 455/81
[58] Field of Search ............ 333/33, 246, 247, 250; 343/5 DD, 18 D, 175, 180, 700 MS; 331/107 SL, 107 DP, 117 D; 325/24, 445, 451; 329/161; 455/81, 326, 327

[56] References Cited
U.S. PATENT DOCUMENTS

| 3,553,610 | 1/1971 | Brenner et al. ............ 333/250 X |
| 3,882,396 | 5/1975 | Schneider ............ 333/250 X |
| 3,980,974 | 9/1976 | Yamamoto et al. ............ 333/33 |
| 4,157,550 | 6/1979 | Reid et al. ............ 343/700 MS X |

*Primary Examiner*—Paul L. Gensler
*Attorney, Agent, or Firm*—Craig and Antonelli

[57] ABSTRACT

A microwave integrated circuit device for reception wherein a microwave integrated circuit substrate is mounted on a short-circuited plane of an inner surface of a waveguide, a rectangular groove is provided in the short-circuited plane, and a mixer diode is arranged astride the groove.

2 Claims, 6 Drawing Figures

MICROWAVE INTEGRATED CIRCUIT DEVICE

LIST OF THE PRIOR ART

The following reference is cited to show the state of the art: U.S. Pat. No. 3,778,717.

BACKGROUND OF THE INVENTION

(1) Field of the Invention

This invention relates to a microwave integrated circuit device in which a waveguide and a microwave integrated circuit (hereinbelow, abbreviated to "MIC") including a strip line etc. are made integral and which is small in size, low in cost and high in reliability.

(2) Description of the Prior Art

Devices exploiting the Doppler effect are known as a vehicular speed sensor (or speedometer) to be disposed on an automobile and as an apparatus for detecting a moving object.

From the viewpoint of size, cost and reliability, the devices are constructed by combining a waveguide and a MIC.

In the device hitherto proposed, in order to connect the waveguide circuit to the MIC composed of a strip line etc., there has been attempted an expedient wherein the MIC is provided with a coaxial connector and the waveguide is connected thereto through a separate coaxial waveguide adapter, or an expedient wherein an antenna pattern is formed on the front surface of a MIC plate, a conductor on the rear surface is taken off and inserted into the waveguide and a micro strip line on the plate is directly changed into the waveguide. With such expedients, however, the insertion loss of the circuit increases to degrade characteristics thereof. Further disadvantages are that the attachment or detachment of the MIC to or from the waveguide is troublesome and that the cost of the whole device becomes high. In order to eliminate such disadvantages and to make the MIC device easy in the attachment and detachment, excellent in airtightness and low in cost, the inventors have proposed a MIC device in which a MIC is mounted on a short-circuited plane within a waveguide. In this device, however, a solid-state element such as semiconductor diode and transistor, especially a mixer diode in the case of using the device as a receiving device is situated in close proximity to the short-circuited plane of the waveguide, so that the coupling between the solid-state element and an electrostatic field is liable to become insufficient. This leads to the disadvantage that the sensitivity of the microwave circuit device cannot be made sufficiently high.

SUMMARY OF THE INVENTION

This invention has for its object to provide a MIC device wherein a MIC plate is arranged on a short-circuited plane within a waveguide, that is, an inner surface of an end wall of the waveguide, the electromagnetic coupling between a MIC and the waveguide being efficiently executed.

This invention for accomplishing the above-mentioned object consists in a MIC device wherein a MIC plate formed on a substrate made of an insulator is mounted on a short-circuited plane, that is, an end wall, of a waveguide, characterized in that a concave or groove is formed near the short-circuited plane of the waveguide and that a diode or the lead line connected with the diode is arranged astride the concave.

The concave or groove is a hollow provided in the end wall of the waveguide and has an opening which is smaller than the cross section of the waveguide. The shape of the concave or groove may be any of the forms of a cylinder, a gap etc.

According to the MIC device of this invention, the concave is formed in only that part of the wall of the waveguide which corresponds to the diode of the MIC or the lead line thereof. Therefore, the magnetic field distribution of the receiving element portion is intensified without exerting any influence on the other portions of the MIC, the electromagnetic coupling between received electromagnetic waves and the diode is made sufficient, and an enhancement in the sensitivity is achieved.

In particular, in a receiving device with a sensor which exploits the Doppler effect of microwaves, a mixer diode is used. The MIC device according to this invention can demonstrate a special effect for the enhancement of the receiving sensitivity of such a device.

The aforecited and other objects and features of this invention will become more apparent from the following description taken in conjunction with the drawings.

DESCRIPTION OF THE PREFERRED EMBODIMENTS

Figure 1:
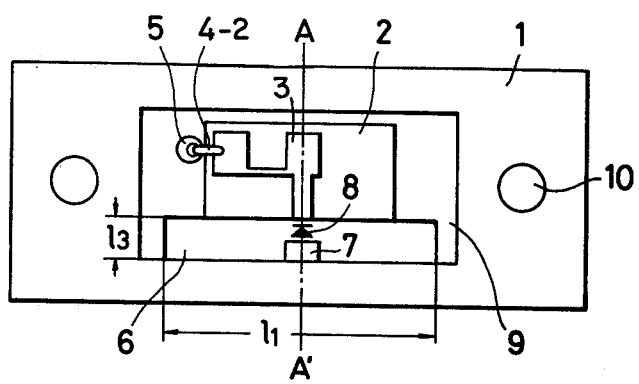
FIG. 1 is a front view of an embodiment of a MIC device for reception only according to this invention.
Figure 2:
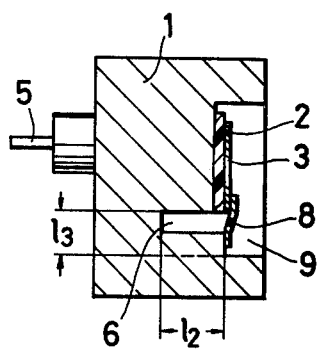
FIG. 2 is a vertical sectional view of the embodiment in FIG. 1.

FIG. 1 is a front view of an embodiment of a MIC device for reception only, according to this invention, while FIG. 2 is a vertical sectional view taken along one-dot chain line A–A' in FIG. 1.

In the construction of FIGS. 1 and 2, numeral 1 designates an outer wall of a waveguide. A substrate 2 which constitutes a microwave integrated circuit (MIC) is mounted on a short-circuited plane of a waveguide portion 9 with, e.g., soldering or a screw. On the MIC substrate 2, a MIC conductor 3 made of a micro strip line is formed.

An electromagnetic coupling groove 6 in the form of a square pillar ($l_1$ in length, $l_2$ in depth and $l_3$ in height) is provided in the short-circuited plane of the waveguide. A beam-lead mixer diode 8 is mounted in a manner to stride the groove. A projecting conductor 7 serves to facilitate the mounting of the mixer diode. A received signal from the mixer diode 8 is fed via a lead wire 4-2 and derived from a signal output terminal 5, and is delivered to a data or signal processing circuit (not shown) succeeding to the terminal.

Figure 3:
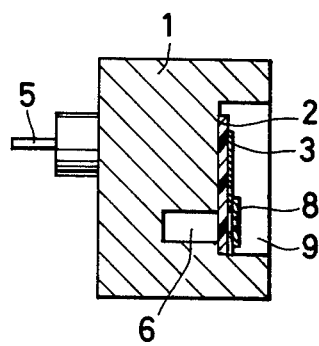
FIG. 3 is a vertical sectional view of another embodiment of the MIC device for reception only, according to this invention.

FIG. 3 is a side sectional view which shows another embodiment of the MIC device according to this invention. In FIG. 3, a MIC substrate 2 is mounted in a manner to cover up a coupling groove 6, and a mixer diode 8 is connected to a MIC conductor 3 formed on the MIC substrate. The mixer diode 8 is so mounted as to overlie and stride the groove 6. As regards that part of the MIC substrate 2 which is to overlie the groove 6, MIC conductor parts on the front and rear surfaces are removed in advance so as to facilitate the penetration of microwaves (reflected waves) into the groove 6. When, with such a structure, a dielectric material of low loss is used for the MIC substrate, substantially the same electromagnetic coupling characteristic as in FIG. 1 is attained. A further merit is that the mounting of the diode of e.g. the beam lead type is facilitated.

Figure 4:
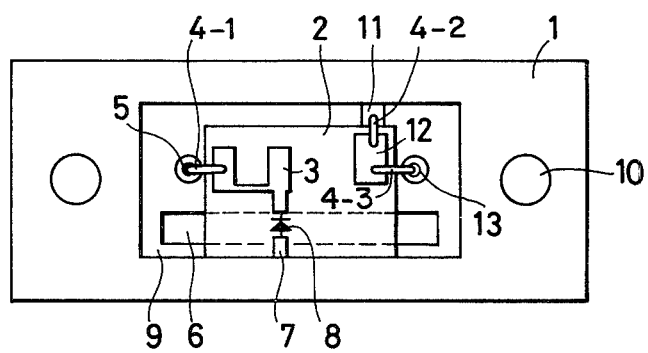
FIG. 4 is a front view of a MIC device for both transmission and reception according to this invention.

FIG. 4 is a front view showing still another embodiment of the MIC device to which this invention is applied. It illustrates a structure using the device as a MIC device for both transmission and reception, e.g. Doppler radar. Referring to the figure, a solid-state oscillator element 11 is mounted near one end of a MIC substrate 2, and it is connected to a resonator 12 by a lead wire 4-2 such as gold ribbon. A bias voltage for the solid-state oscillator element 11 is applied by a lead wire 4-3 via a D. C. bias terminal 13. As in the cases of FIGS. 1 and 3, a mixer diode 8 is mounted in a manner astride a groove 6. In such a structure, most of an oscillation output from the solid-state oscillator element 11 leaks into a waveguide 9 owing to the lead wire 4-2 as well as the resonator 12 and becomes a transmission output. Part of the oscillation output is supplied to the mixer diode 8 as local oscillation power. On the other hand, reflected waves pass through the waveguide 9 and are received by the mixer diode 8 through the groove 6 owing to the electromagnetic coupling. That is, in the structure of this invention, the electromagnetic field (reflected waves) within the waveguide leaks into the groove 6, so that the quantity of coupling with the mixer diode 8 increases. As a result, the effect is produced that the receiving sensitivity becomes high.

While varying the length ($l_1$) of the coupling groove 6, the quantities of coupling were measured as D. C. voltages across a resistor load (1 kΩ) connected to a receiving end. The results are as given in Table 1. In this case, $l_2$ and $l_3$ were made fixed values given in the table. The groove depth $l_2$ needs to be approximately ⅛ wavelength, while the groove width $l_3$ is made as small as approximately 1.5 mm in order to diminish the inductance of a lead line of the mixer diode.

TABLE 1

| Oscillation frequency | Wavelength ($\lambda_g$) | Length ($l_1$) of Groove | Received voltage $l_1/\lambda_g$ | ($V_M$) | Note |
|---|---|---|---|---|---|
| 19 GHz | 23.4 mm | 9 mm | 0.38 | 100 mV | $l_2$ = 2 mm, $l_3$ = 1.5 mm, input power = 1 mW, $V_M$ denotes a receiving end D. C. voltage at the time |
|  |  | 6 mm | 0.26 | below 1 mV |  |
| 24 GHz | 15.4 mm | 6 mm | 0.39 | 100 mV |  |
|  |  | 4 mm | 0.26 | below 1 mV |  |

TABLE 1-continued

| Oscillation frequency | Wavelength ($\lambda_g$) | Length ($l_1$) of Groove | Received voltage $l_1/\lambda_g$ | ($V_M$) | Note |
|---|---|---|---|---|---|
|  |  |  |  |  | when a resistor load of 1 kΩ is connected to a mixer diode terminal. |

Table 1 reveals that when the length $l_1$ of the coupling groove 6 becomes less than ¼·$\lambda_g$ ($\lambda_g$: guide wavelength), the quantity of coupling becomes below 1/100 as compared with the best value in the vicinity of 0.38$\lambda_g$, and that $l_1$ needs to be made at least ¼·$\lambda_g$.

Although, in the foregoing embodiments, the concave near the short-circuited plane is in the form of the square pillar, it is not restricted thereto but can be set as desired, e.g., in the form of a circular cylinder or in a form comprising a circular cylinder and a square pillar in combination. Although, in the foregoing, the concave is formed in the short-circuited plane of the waveguide, it may well be formed in the side wall of the waveguide in the vicinity of the short-circuited plane.

Figure 5:
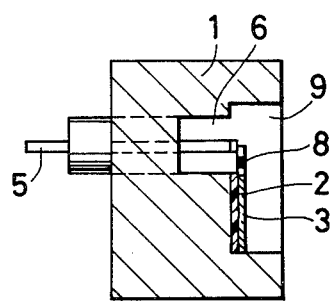
FIGS. 5 and 6 are vertical sectional views of MIC devices for reception only, according to this invention.
Figure 6:
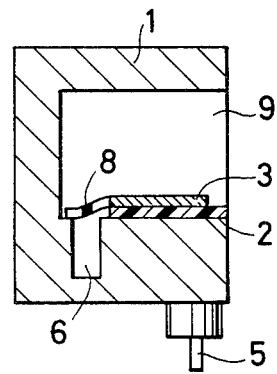

FIG. 5 and 6 are views illustrative of the construction of further embodiments of the MIC device according to this invention. Parts with the same reference numerals as in FIGS. 1 to 4 have the same functions, and the detailed explanation is omitted.

FIG. 5 shows an embodiment wherein a hole in the shape of a circular cylinder is provided in a coaxial connector portion of a short-circuited plane and wherein a semiconductor element is coupled between an end of a central conductor and a MIC plate 2.

The embodiment in FIG. 6 is so constructed that a prismatic groove is formed in the side wall of a waveguide near a short-circuited plane thereof and that a solid-state element is arranged astride the groove.

As the solid-state oscillator element, there can be employed e.g. a Gunn diode, impatt diode, bipolar transistor, field-effect transistor, BARITT diode, or the like.

We claim:

1. A microwave device having a rectangular waveguide having an end wall closed by a short circuit plane and a microwave integrated circuit (MIC) formed on a substrate for detecting a low frequency signal from a diode installed in the waveguide, characterized in that said substrate is mounted on the inner surface of said end wall, said diode is mounted on said substrate and connected to said microwave integrated circuit (MIC), and a groove having a rectangular opening of which a larger side is parallel with the longer wall of the rectangular waveguide and is of length at least ¼$\lambda_g$, wherein $\lambda_g$ is wavelength in the waveguide, said diode being mounted across the smaller dimension of said groove.

2. A microwave device according to claim 1, wherein the depth of the groove in the direction of the waveguide axis is approximately $\lambda_g/8$.

* * * * *